(12) United States Patent
Juntunen et al.

(10) Patent No.: US 6,181,141 B1
(45) Date of Patent: Jan. 30, 2001

(54) FAILSAFE MONITORING SYSTEM FOR POTENTIOMETERS AND MONITOR INTERFACE

(75) Inventors: Robert Dean Juntunen, Minnetonka, MN (US); James I. Bartels, Hudson, WI (US)

(73) Assignee: Honeywell Inc., Minneapolis, MN (US)

( * ) Notice: Under 35 U.S.C. 154(b), the term of this patent shall be extended for 0 days.

(21) Appl. No.: 09/235,176

(22) Filed: Jan. 22, 1999

(51) Int. Cl.[7] .............................. G01R 31/08; G01R 27/08
(52) U.S. Cl. .............................................. 324/525; 324/723
(58) Field of Search .................................. 324/525, 705, 324/723, 715, 158.1, 714; 702/64, 65, 57, 117–126, 183–185

(56) References Cited

U.S. PATENT DOCUMENTS

| | | | |
|---|---|---|---|
| 3,852,665 | * 12/1974 | Bothner | 324/723 |
| 4,866,363 | 9/1989 | Patton et al. | 318/663 |
| 4,987,372 | * 1/1991 | Tengorang et al. | 324/705 |
| 5,107,427 | 4/1992 | Peter et al. | 364/424.03 |
| 5,289,134 | 2/1994 | Kohr | 324/714 |
| 5,812,411 | * 9/1998 | Calabrese et al. | 702/64 |

* cited by examiner

Primary Examiner—Safet Metjahic
Assistant Examiner—Anjan K Deb
(74) Attorney, Agent, or Firm—Merchant & Gould P.C.

(57) ABSTRACT

A controller, having a microprocessor, a control potentiometer and a monitor interface circuit connected between the microprocessor and the potentiometer, operates to monitor the control potentiometer and monitor interface circuit for failures. The potentiometer along with its wiring terminals and its wiper are monitored for faults. In addition the monitor interface circuit itself is tested so that either a fault in the potentiometer or a fault in the monitor interface circuit will be detected. The monitoring includes three tests performed from time to time. First, voltages across the full potentiometer are measured and compared to a voltage determined at initial installation or commissioning. The measured voltage is compared against limits to detect whether the measured voltage is inside or outside the limits. Second, the voltage across the wiper selected portion of the control potentiometer is measured and compared against a threshold to detect a fault. Third, testing of the monitor interface circuit is accomplished by inhibiting any voltage or current drive into the full potentiometer and the wiper selected portion of the potentiometer and then measuring voltages across the full potentiometer and the wiper selected portion. A fault in the monitor interface circuit is indicated if the measured voltages under these conditions are outside a predetermined tolerance range from ground.

14 Claims, 6 Drawing Sheets

FAILSAFE MONITORING SYSTEM FOR POTENTIOMETERS AND MONITOR INTERFACE

BACKGROUND OF THE INVENTION

1. Field of the Invention

This invention relates to a method and apparatus for monitoring in a fail-safe manner potentiometers used in critical control operations. More particularly, the invention relates to monitoring in a fail safe manner the characteristics of potentiometers where the detected control value from a control potentiometer is a critical safety factor in a control system.

2. Description of Prior Art

Determining the absolute position of valves and/or dampers in combustion systems is a critical safety issue. A system such as a non-flow compensating fuel-air ratio control system controlling a large boiler and using potentiometer settings to control the position of valves and dampers is a system where monitoring of the control potentiometers is a critical life safety factor. Control of actuators for a valve and/or damper in such a combustion system in the past has been accomplished with a motor driven mechanical cam. Such a device has mechanical limits to provide for fail-safe control of the valves and dampers. Due to the mechanical linkages and the limits placed on the mechanical linkages, the fuel-air ratios were never permitted to enter a hazardous range of operation.

In today's environment with microprocessor control and electronic sensing of desired position and electronic feedback to control valves, an electronic failure of a control potentiometer can create a fuel-air ratio in a combustion system that is hazardous. Furthermore, because of the harsh operating environment and because of aging, a control potentiometer's resistance may vary. Also, the resistance at the potentiometer's connector terminals may vary, and the wiper resistance on the potentiometer may change. Any one of these changes or all these changes together can create a situation where an incorrect control signal is provided by the potentiometer monitoring circuit to a controlling microprocessor that controls critical elements such as fuel-air valves. What is needed is a fail-safe monitoring system for potentiometers.

SUMMARY OF THE INVENTION

In accordance with this invention the above problems with monitoring control potentiometers have been solved by using a computer processor and a monitor interface circuit connected between the potentiometer and the processor, and then monitoring through the monitor interface circuit the potentiometer, its terminals and its wiper for faults. In addition the monitor interface circuit itself is tested so that a fault in the potentiometer or a fault in the monitor interface circuit is detected to prevent the control potentiometer and monitor interface circuit from producing an incorrect control signal.

In one feature of the invention the monitoring is accomplished by measuring changes in the fill potentiometer resistance from a predetermined value. The changes are compared against boundary limits to detect whether a change is inside or outside the boundary limits. A fault in the control potentiometer is indicated when a change is outside the boundary limits.

In another feature of the invention the monitoring also monitors wiper resistance of the potentiometer. The wiper resistance of the control potentiometer is measured, and the wiper resistance is compared against a fault threshold to detect if the wiper resistance has passed the fault threshold. A fault in the wiper of the control potentiometer is indicated when the wiper resistance has passed the threshold.

In another feature of the invention, the testing of the monitor interface circuit is accomplished by measuring idle signals applied to the full potentiometer and to the wiper when the monitor interface circuit is an idle state. The idle signals are compared against an expected signal to detect if the idle signals are within a predetermined tolerance range of the expected signal. A fault in the monitor interface circuit is indicated if the idle signals are outside the predetermined tolerance range.

Other features, utilities and advantages of the invention will be understood by those of ordinary skill in the art after referring to the complete written description of the preferred embodiments of the invention in conjunction with the following drawings.

DETAILED DESCRIPTION OF THE PREFERRED EMBODIMENTS

Figure 1:
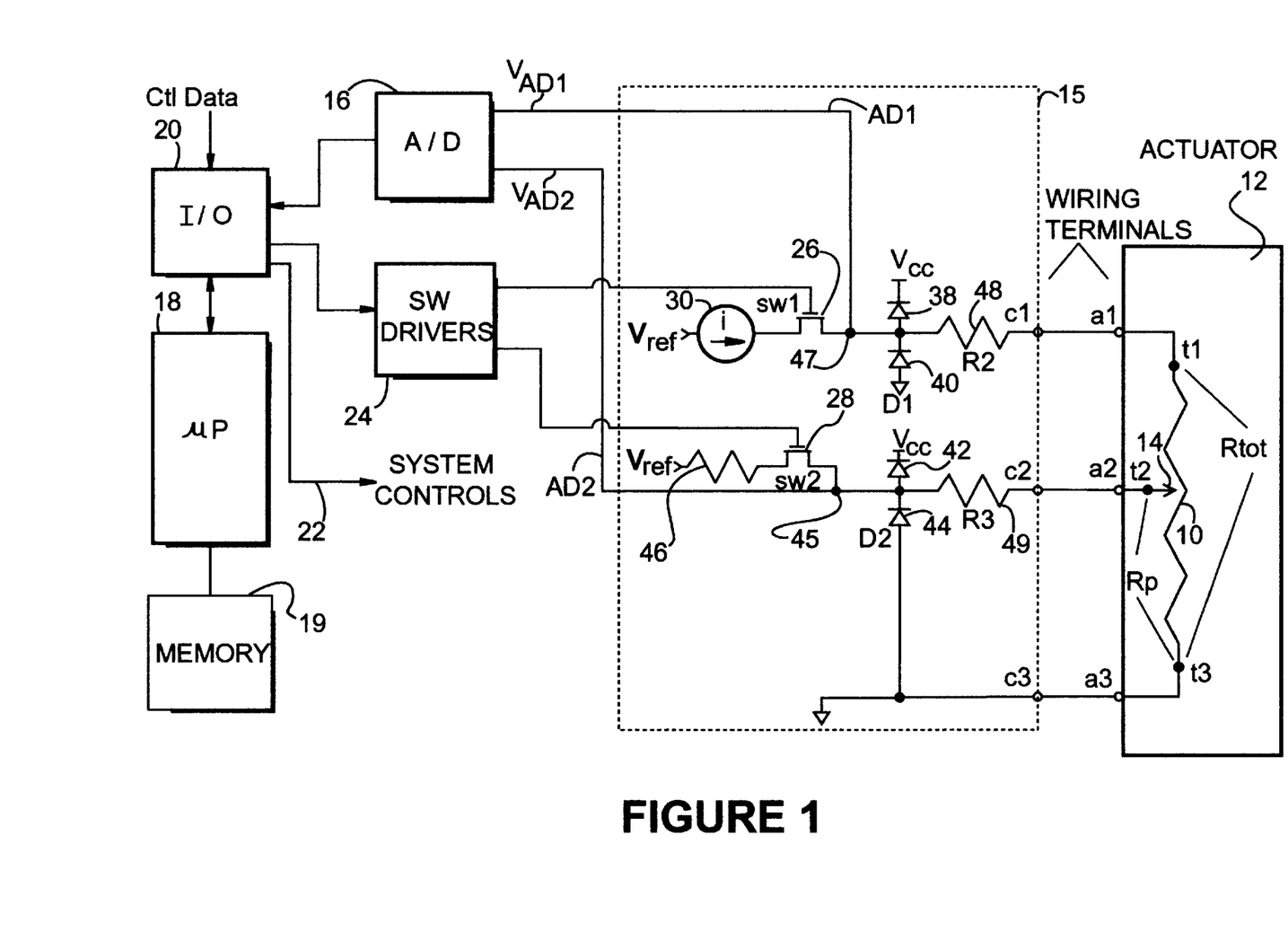
FIG. 1 shows a preferred embodiment of the invention for monitoring a control potentiometer.

In the preferred embodiment of the invention shown in FIG. 1, the control potentiometer 10 is located with the actuator 12 associated with the potentiometer. Adjustments of the wiper 14 produces a voltage across line AD2 to analog digital converters 16. The digital value of this voltage is input to the microprocessor 18 through the I/O controller 20. The microprocessor 18 contains the control program for controlling actuators, including actuator 12, by providing a control signal out through I/O controller 20 over a control line 22. During commissioning of the control system, the actuators are installed, the potentiometer is installed and the control system is initialized with initial values for the potentiometer 10.

After commissioning and during a normal operation of controlling actuator 12, microprocessor 18 controls switch drivers 24 to switch field effect transistor 26 "ON" and field effect transistor 28 "OFF." With transistor 26 ON, the current source 30 drives a current "i" through potentiometer 10. Depending on the position of the wiper 14, a voltage is fed back on line AD2 as a control voltage for the microprocessor 18. This constitutes the normal operation of the potentiometer 10 where the position of wiper 14 on the potentiometer results in a control signal used by microprocessor 18 to control actuator 12.

A problem arises in that over time the resistance of potentiometer 10 and the resistance of wiper 14 may change. Further, the wiring terminals in sets c1 a1, c2 a2 and c3 a3, connecting the potentiometer and its wiper to the monitor interface circuit 15 may corrode and add to the apparent resistance of the potentiometer. Also, the wiper contact with the potentiometer may corrode or wear and add resistance at the wiper. All of these changes and/or deterioration in the operating characteristic of the potentiometer can produce an incorrect potentiometer (pot) signal on line AD2 back to microprocessor 18. In addition, components in the monitor interface circuit 15 may fail and create an incorrect pot signal. With an incorrect pot signal feedback to microprocessor 18, the microprocessor will send an incorrect actuator control signal over the control line 22 to actuator 12. A bad actuator control signal could produce a dangerous adjustment of actuator 12. Accordingly, the microprocessor 18 also performs fail-safe monitoring operations to monitor failure of the potentiometer 10 or monitor interface circuit 15, and these logical operations are illustrated in FIG. 2.

The embodiments of the invention described herein include logical operations when monitoring the control potentiometer. The logical operations of the present invention may be implemented (1) as a sequence of computer-implemented steps running on a microprocessor in a controller, and (2) as interconnected logic modules within the controller. The implementation is a matter of choice, dependent on the performance requirements of the controller. Accordingly, the logical operations making up the embodiments of the invention described herein are referred to variously as operations, steps or modules. The logical operations shown in FIGS. 2–5 will be described in reference to these figures and also FIG. 1.

Figure 2:
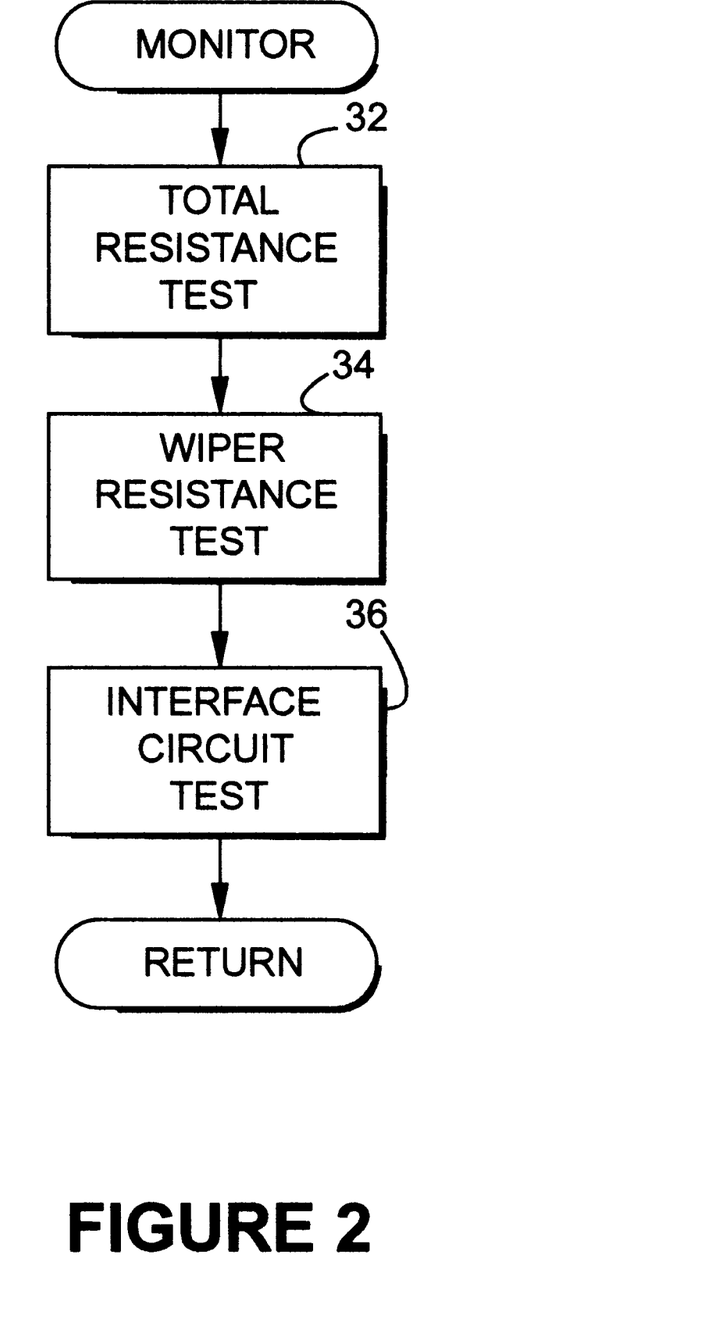
FIG. 2 shows the logical operations performed by the apparatus in FIG. 1 during the fail-safe monitoring of the potentiometer.

In FIG. 2, the monitoring operations consist of three modules—a total resistance test module 32, a wiper resistance test module 34, and an interface circuit test module 36. These test modules perform the monitoring operations whereby a faulty interface circuit or a faulty potentiometer is detected before a dangerous control adjustment is made to an actuator. The total resistance test module 32 is designed to monitor the total resistance across potentiometer 10. A total pot resistance value is initially determined for potentiometer 10 during commissioning. By monitoring changes in this total pot resistance against the boundary limits for an operative potentiometer, a faulty potentiometer or an increase in resistance of wiring terminals c1 a1 or c3 a3 may be detected.

The monitoring operations of FIG. 2 also perform a wiper resistance test in test module 34. Wiper resistance test module 34 is testing for changes in the wiper resistance which is the resistance through the wiper 14 to ground. While the wiper selected pot resistance Rp may change with age or environment, it is more likely that changes in wiper resistance will be due to changes in wiper contact resistance or changes in resistance across terminals c2 a2 and c3 a3. Wiper resistance in this embodiment is tested against a failure threshold which guarantees that wiper resistance will not cause an incorrect control value to be passed back to microprocessor. If the wiper resistance exceeds the fault threshold, then the potentiometer is indicated as having a faulty wiper resistance and the controller shuts down the system being controlled.

The monitoring operations also include the interface circuit test module 36. The interface circuit module 36 operates to test the components in the monitor interface circuit 15; i.e., the correct functioning of switches 26 and 28 as well as the transient protection diodes 38 and 42. A failure threshold for the monitor interface circuit is stored in memory 19 or provided as control data to microprocessor 18. If the monitor interface circuit detects signals outside of a tolerance threshold during idle mode when the potentiometer is not being driven by the circuit, the monitor interface circuit will be indicated as faulty.

By testing the potentiometer, its terminals and its wiper with a monitor interface circuit and further by testing the monitor interface circuit itself, the logical operations in FIG. 2 will prevent a fault in the potentiometer 10 or a fault in the interface circuitry to potentiometer 10 from creating a control signal that would drive actuator 12 to produce a dangerous condition.

Figure 3:
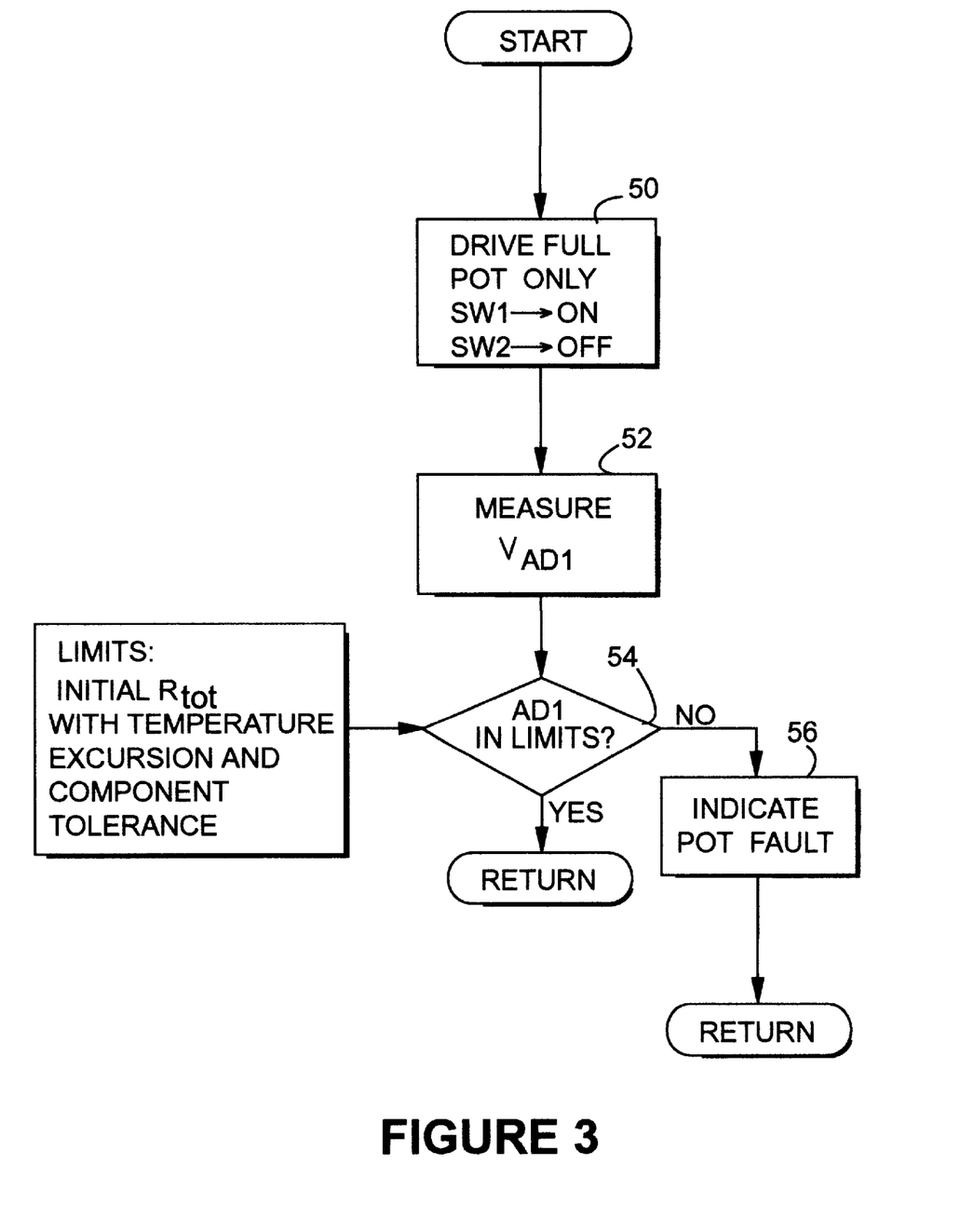
FIG. 3 shows the logical operations to implement the total resistance test module in FIG. 2.

FIG. 3 illustrates the logical operations performed by the total resistance test module 32 in FIG. 2. The total resistance test begins in logical operation 50 which provides a current drive through potentiometer 10. This is accomplished by microprocessor 18 acting through switch drivers 24 to turn ON transistor 26 and turn OFF transistor 28. With transistor 26 ON, the current source 30 provides a current "i" through potentiometer 10. With transistor 28 (switch 2) turned OFF, reference voltage applied through resistor 46 is blocked. Accordingly, the only voltage on line AD1 will be due to the current "i" creating a voltage drop across resistor 48, terminal c1 a1, potentiometer total resistance $R_{tot}$ and the resistance cross c3 a3. Operation 52 in FIG. 3 measures the voltage at line AD1. Analog digital converter 16 converts this voltage into a digital value which is provided through the input/output control 20 to the microprocessor 18. The digital value at AD1 may then be used directly as a test value or the microprocessor 18 can divide the digital value by a known value for the current "i" from current source 30 to determine the resistance from node 47 to ground. With the resistance from node 47 to ground known, then the resistive value R2 of resistance 48 may be subtracted to determine the total resistance Rtot of the potentiometer 10 plus the resistance of terminals c1 a1 and c3 a3. During commissioning of the control system, the voltage on AD1 ($V_{AD1}$) is sensed while SW1 is ON and SW2 is OFF. $V_{AD1}$ is converted to a digital value by analog to digital converter 16. From the value for $V_{AD1}$ and knowing a predetermined value for current "i" from current source 30, microprocessor 18 divides $V_{AD1}$ by "i" to determine an AD1 resistance between node 47 and ground. During commissioning, this AD1 resistance should be Rtot plus R2 since resistance of terminals c1 a1 and c3 a3 should be negligibly small compared to Rtot. By subtracting R2 from the AD1 resistance, $R_{tot}$ is determined. $R_{tot}$ value is stored in memory as well as the initial value for $V_{AD1}$ at commissioning.

After the voltage at $V_{AD1}$ is measured, decision operation 54 detects whether the $V_{AD1}$ is within limits. The limits are set based upon (1) an initial value for the total pot resistance $R_{tot}$, (2) expected temperature excursions creating resistance changes in the potentiometer 10 and (3) the tolerance of the components, resistor 48 and potentiometer 10. The initial value for $R_{tot}$ is determined at commissioning as described above. If $V_{AD1}$ is within limits, the test is completed and the logical operation is returned to the monitor main operation flow in FIG. 2. If $V_{AD1}$ is out of limits, the operation flow branches NO from decision operation 54. Operation 56 indicates a potentiometer fault, and the operation flow returns to the monitor operation flow in FIG. 2.

Figure 4:
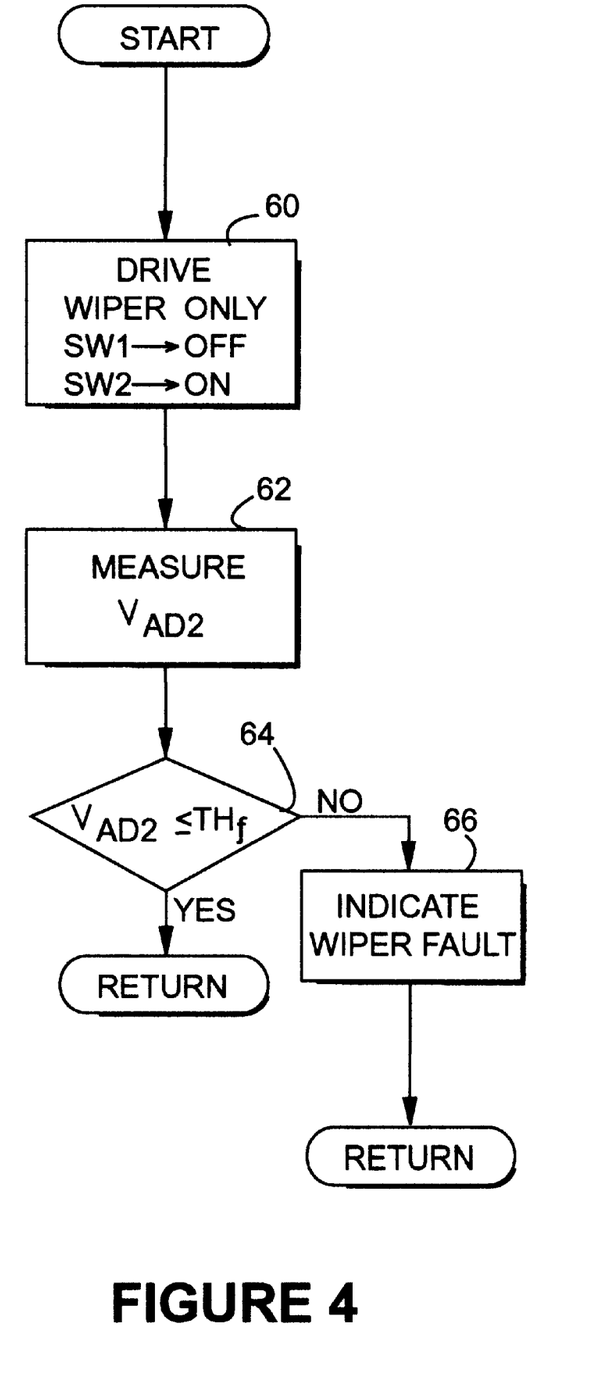
FIG. 4 shows the logical operations to implement the wiper resistance test module in FIG. 2.

FIG. 4 shows the logical operations performed by the wiper resistance test module 34 of FIG. 2. The wiper resistance test begins in logical operation 60. Logical operation 60 provides a voltage drive only through the wiper 14 and the resistance $R_p$ of the portion of the potentiometer 10 between wiper 14 and ground. This is accomplished by the microprocessor 18 acting through switch driver 24 to turn OFF transistor 26 (switch 1) and to turn ON transistor 28 (switch 2). The reference voltage $V_{ref}$ is thus applied across resistor 46, resistor 49 and resistance Rp to ground. In addition, there will be some amount of small resistance due to terminals c2 a2 and c3 a3. Line AD2 connects node 45 back to analog digital converter 16. Accordingly, the voltage $V_{AD2}$ at node 45 is a measure of the resistance between node 45 and ground. The resistive values for resistor 46 and 49 are known. Accordingly, the voltage dividing action between resistor R1 and the resistance across R3, terminal c2 a2, wiper contact resistance, resistance Rp and terminal c3 a3 define the voltage of $V_{AD2}$. This voltage is converted by the analog digital converter 16 to a digital value applied to the microprocessor 18 for analysis.

The resistance $R_p$ can be computed from the resistance $R_{tot}$ based on the position of the wiper. For example if $R_{tot}$ is 5 k ohms, and the wiper is positioned ⅖ths from the bottom potentiometer 10, then $R_p$ is 2 k ohms. Changes in $R_p$ can be monitored by computing a value for $R_p$ based on the voltage drop across resistor 46 and resistor 49 plus $R_p$ since the values R1 and R3 are known and assuming wiper contact resistance and resistance across terminals c2 a2 and c3 a3 are negligible. If the wiper contact resistance and the resistance across the terminals are not negligible, then the microprocessor can compute the combined resistance across terminals c2 a2 plus wiper contact resistance plus resistance $R_p$ plus resistance across terminal c3 a3. In one embodiment a fault threshold for combined resistance is used by the computer to determine when this combined threshold is too high. In another embodiment it is assumed that changes in $R_p$ and changes in the resistance across the terminals are small compared to changes in wiper contact resistance. Wiper contact resistance can be computed using the following expression:

$$R_{CR}=(Vref*(R3+R_p)-V_{AD2}*(R1+R_{ON}+R3+R_p))/(V_{AD2}-Vref)$$

where:

$R_{CR}$ is wiper contact resistance;

$V_{AD2}$ is the value of voltage on line AD2 with SW1 OFF and SW2 ON;

Vref is value of reference voltage Vref;

$R_{ON}$ is the "ON" channel resistance of SW2;

R1 is resistance or resistor 46;

R3 is resistance of resistor 47;

$R_p$ is resistance of potentiometer as selected by wiper.

With $R_{CR}$ calculated and monitored, the value of $R_{CR}$ can be compared against a threshold to detect excessive wiper contact resistance.

Figure 6:
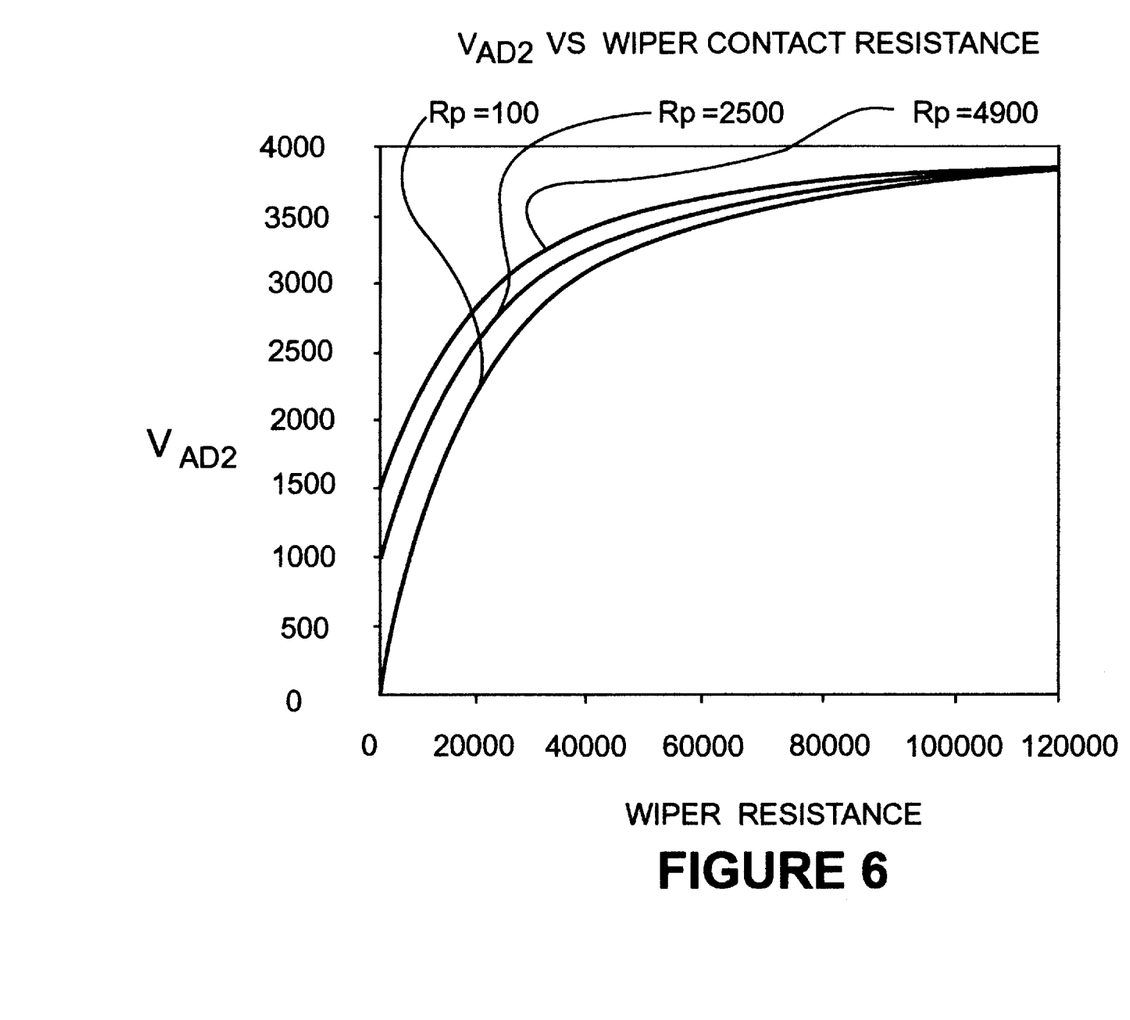
FIG. 6 is a graph of a measurement voltage $V_{AD2}$ during a wiper resistance test.

However, more simply, in operation 62 of FIG. 4, the microprocessor measures the voltage $V_{AD2}$ (voltage on line AD2). This voltage is converted to a digital value and the microprocessor in decision operation 64 compares $V_{AD2}$ value against a voltage threshold value. Decision operation 64 is testing the voltage $V_{AD2}$ against a predetermined fault threshold. The fault threshold is based upon observed changes in $V_{AD2}$ due to changes in the wiper contact resistance and based upon different values of $R_p$. FIG. 6 is a graph of digital values for $V_{AD2}$ as a function of wiper contact resistance for three different values of $R_p$. This graph indicates that as wiper contact resistance increases, it rapidly swamps out changes in $V_{AD2}$ due to changes in $R_p$. Therefore in the example of FIG. 6 a fault threshold value of 2500 is a good choice. If the wiper contact resistance is such that $V_{AD2}$ exceeds the fault threshold, the operation flow branches NO from decision operation 64 to operation 66. Operation 66 indicates a wiper fault and the logical operation returns to the main monitor program in FIG. 2. If the voltage $V_{AD2}$ is less than the fault threshold, the wiper contact resistance is within an acceptable limit, and the operation flow branches YES from decision operation 64 to return to the main monitor operation flow in FIG. 2.

Figure 5:
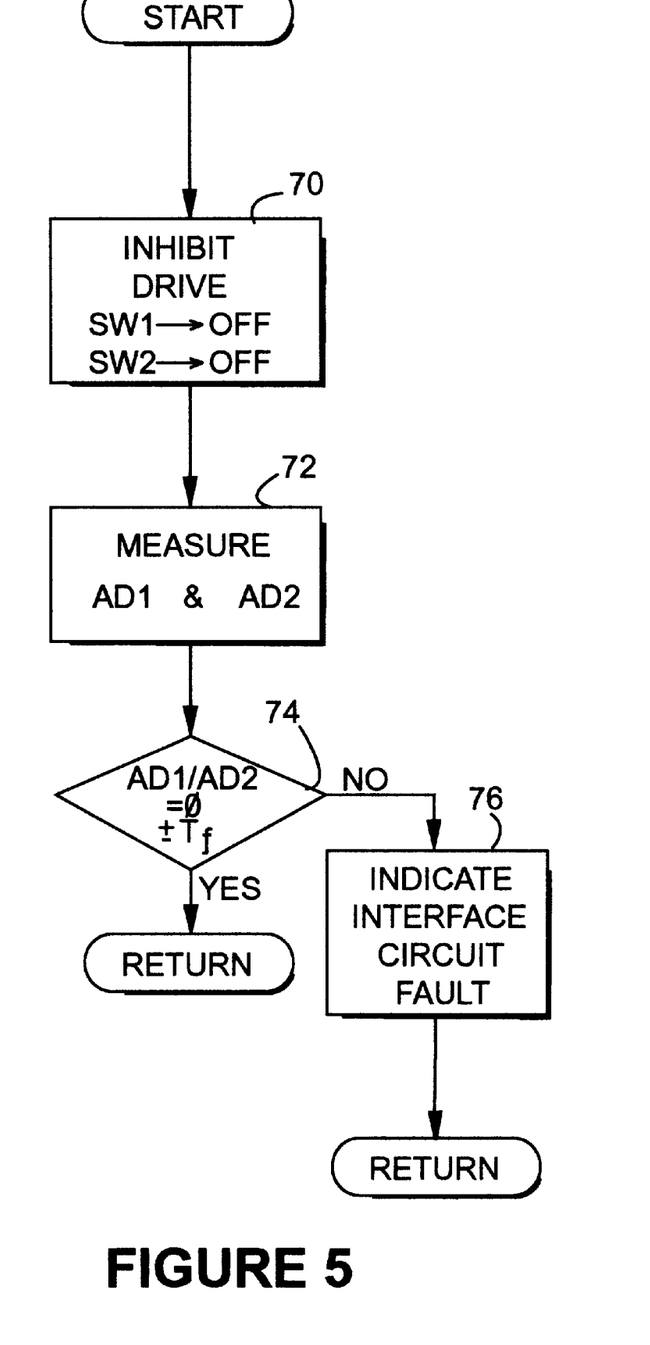
FIG. 5 shows the logical operations to implement the interface circuit test module of FIG. 2.

FIG. 5 illustrates the logical operations of the interface circuit test module 36 in FIG. 2. The interface circuit test begins at logical operation 70 in FIG. 5 which inhibits all current or voltage drive to the potentiometer 10 from the monitor interface circuit 15, i.e., the idle state. This is accomplished by the microprocessor 18 acting through the switch drivers 24 to turn OFF both transistor 26 (switch 1) and transistor 28 (switch 2). This isolates the current source 30 from the potentiometer and also isolates the voltage Vref from the potentiometer 10. In the idle state, the expectation then is that the voltage at node 47 and node 45 should be zero volts plus or minus a very minor tolerance. If there is a failure of transistor 26 so that some current flow from current source 30 is being passed, or if there is a failure of the diode 38 such that some voltage other than zero is being applied at node 47, then the $V_{AD1}$ sensed by microprocessor 18 through analog digital converter 16 is out of tolerance. Operation 72 in FIG. 5 measures the voltage on line AD1. Operation 72 also measures the voltage $V_{AD2}$ on line AD2 which is the voltage at node 45. This voltage should be near zero unless transistor 28 has failed to isolate Vref from the wiper or diode 42 has failed. The value for $V_{AD2}$ should be at zero plus or minus a very minor tolerance value for leakage across the back-biased junctions of transistor 28 and diode 42. After operation 72 in FIG. 5 has measured the voltage at AD1 and the voltage at AD2, decision operation 74 tests each of these voltage values against zero volts, plus or minus, a fault tolerance. The fault tolerance is based on the accuracy of the converter 16 and the quality of transistor 26 and transistor 28 at the maximum operating temperature of circuit 15 in FIG. 1. If decision operation 74 detects that the voltage of both $V_{AD1}$ and $V_{AD2}$ are within the tolerance range of zero volts, then the logical operation branches YES and returns to the monitor operation flow in FIG. 2. If decision operation 74 detects that either the voltage at AD1 or AD2 depart from zero volts by more than the tolerance, then the logical operations branch NO from decision operation 74 to operation 76. Operation 76 then indicates a monitor interface circuit fault. The monitor interface circuit 15 may then be replaced or the entire controller including microprocessor can be replaced.

The interface circuit test does not detect a failure of diode 40 or diode 44 as these diodes are connected to ground. The diodes in the monitor interface circuit are provided for transient signal protection. The diodes prevent the voltage at nodes 45 and 47 from going above $V_{CC}$ or below ground. Diodes 40 and 44 could be removed with some risk to the circuit that it would be damaged by a negative transient. Alternatively, leakage through diodes 40 and 44 might be detected by the above described test for wiper contact resistance $R_{CR}$. If $R_{CR}$ is tested and for multiple positions of the wiper and particularly where $R_p$ is near zero, a change in the calculated value for $R_{CR}$ as $R_p$ goes to zero will indicate a fault in diode 40 or diode 44.

While the embodiment shown in FIGS. 2 through 5 performs these tests in series, in another embodiment of the invention the tests are performed in parallel. In this alternative embodiment, the switch drivers 24 rapidly cycle through each of the switch positions, the voltages on sense lines AD1 and AD2 are converted to digital values and stored and the microprocessor multitasks the analysis of the digital values in parallel processing operations.

In another further embodiment, the test modules 32, 34 and 36 are rearranged so that a wiper resistance test is performed as a first test operation or so that the interface circuit test operation is performed as a first operation. The sequence of the tests is a matter of choice. Further, if there is a fault detected in a test, the monitor program in another embodiment terminates the test operations upon detection of first fault and returns the program flow to the main program controlling the combustion system.

To assure that the combustion system is controlled correctly from the potentiometer, the fail-safe monitoring would be performed frequently. Depending upon safety requirements, the monitor operations might be performed hourly or every minute. In a multitasking program operation, the operations could be performed in parallel with normal control operations.

It should be apparent to one skilled in the art that many other embodiments of the invention might be described herein with each embodiment built on equivalents in structure and function of the elements of the embodiments described above. It is not possible to describe all possible embodiments without writing an encyclopedia of potentiometer control systems. While the invention has been described with reference to preferred embodiments and several equivalents have been suggested for elements of the invention, as discussed above it will be apparent to one skilled in the art that there are other equivalents in structure and function available today or contemplated for future development that could be substituted for elements of this invention. With such substitution of equivalent elements in mind, we believe the following claims capture the spirit and scope of our invention.

We claim:

1. In a controller having a processor, a control potentiometer and a monitor interface circuit electrically connected between the control potentiometer and the processor, a method for fail-safe monitoring the control potentiometer and the monitor interface circuit, said method comprising the acts of:

repetitively monitoring resistance of the potentiometer and wiring terminals, that are electrically connecting the control potentiometer to the monitor interface circuit, to detect changes in resistance from an initial resistance determined at time of commissioning the controller and thereby detect a fault in the potentiometer or wiring terminals; and repetitively testing the monitor interface circuit, when no voltage or current is driven into the potentiometer or wiring terminals, to detect a fault in the monitor interface circuit independent of the potentiometer and wiring terminals, whereby a fault in the potentiometer, wiring terminals or monitor interface circuit is detected.

2. The method of claim 1 wherein the act of monitoring comprises:

measuring a detected resistance across the potentiometer and wiring terminals;

detecting if the detected resistance is within limits based on an initial potentiometer total resistance; and indicating a fault in the control potentiometer or wiring terminals when the detected resistance is outside the limits.

3. The method of claim 2 wherein the act of measuring further comprises:

driving a current through the potentiometer and wiring terminals;

measuring a detected voltage across the potentiometer and wiring terminals; and computing the detected resistance by dividing the detected voltage by the current.

4. The method of claim 2 wherein the act of monitoring further comprises:

measuring resistance of a wiper selected portion of the control potentiometer and wiring terminals and wiper connecting the wiper selected portion of the control potentiometer to the monitor interface circuit and indicating a measured wiper resistance;

comparing the measured wiper resistance against a fault threshold to detect if the measured wiper resistance has passed the fault threshold; and indicating a fault in the control potentiometer when said act of comparing detects the measured wiper resistance has passed the fault threshold.

5. The method of claim 4 wherein said act of testing comprises:

measuring signals across the potentiometer and the wiper selected portion when the monitor interface circuit is an idle state;

comparing the signals against an expected signal to detect if the signals are within a predetermined tolerance range of the expected signal; and indicating a fault in the monitor interface circuit if said act of comparing signals detects the signals across the potentiometer and the wiper selected portion are outside the predetermined tolerance range.

6. The method of claim 1 wherein the act of monitoring comprises:

measuring resistance of a wiper selected portion of the control potentiometer and wiring terminals and wiper connecting the wiper selected portion of the control potentiometer to the monitor interface circuit and indicating a measured wiper resistance;

comparing the measured wiper resistance against a fault threshold to detect if the measured wiper resistance has passed the fault threshold; and indicating a fault in the control potentiometer when said act of comparing detects the measured wiper resistance has passed the fault threshold.

7. The method of claim 6 wherein the act of measuring comprises:

applying a voltage drive to the wiper selected portion of the potentiometer;

measuring a voltage drop across the wiper selected portion of the control potentiometer and wiring terminals and wiper connecting the wiper selected portion of the control potentiometer to the monitor interface;

converting the voltage drop to the measured wiper resistance.

8. The method of claim 7 wherein the act of measuring further comprises:

computing a wiper contact resistance from the measured wiper resistance and providing the wiper contact resistance to said act of comparing as the measured wiper resistance.

9. The method of claim 1 wherein said act of testing comprises:

measuring signals across the potentiometer and the wiper selected portion when the monitor interface circuit is an idle state;

comparing the signals against an expected signal to detect if the signals are within a predetermined tolerance range of the expected signal; and indicating a fault in the monitor interface circuit if said act of comparing signals detects the signals across the potentiometer and the wiper selected portion are outside the predetermined tolerance range.

10. In a controller having a processor, a control potentiometer and a monitor interface electrically connected between the control potentiometer and the processor, apparatus for fail-safe monitoring the control potentiometer and the monitor interface, said apparatus comprising:

a first module periodically monitoring through the monitor interface the voltage across the potentiometer and wiring terminals electrically connecting the control potentiometer to the monitor interface to detect changes in resistance from an initial resistance determined at time of commissioning the controller and thereby detect one or more faults in the potentiometer and wiring terminals; and a second module periodically testing the monitor interface, while the potentiometer is not driven, to detect a fault in the monitor interface independent of the potentiometer and wiring terminals, whereby faults in the potentiometer and monitor interface are detected.

11. The apparatus of claim 10 wherein said first module comprises:

a measure module measuring voltage across the potentiometer and wiring terminals and indicating a measured voltage;

a detect module detecting if the measured voltage is within limits, the limits based on an initial voltage across the potentiometer and wiring terminals at time of commissioning, variations in voltage due to temperature variations and component tolerance;

an indicate module indicating a fault in the control potentiometer when said detect module detects the measured voltage is outside the limits.

12. The apparatus of claim 11 wherein said first module further comprises:

a second measure module measuring voltage across a wiper selected portion of the control potentiometer and wiring terminals and wiper connecting the wiper selected portion of the control potentiometer to the monitor interface and indicating a measured wiper voltage;

a test module comparing the measured wiper voltage against a fault threshold to detect if the measured wiper voltage has exceeded the fault threshold; and second indicator module indicating a fault when said test module detects the measured wiper voltage has exceeded the fault threshold.

13. The method of claim 12 wherein said second module comprises:

an inhibit module for inhibiting voltage or current drive to the control potentiometer;

third measure module, while voltage or current drive to the control potentiometer is inhibited, measuring a first voltage across the control potentiometer and wiring terminals connected to full potentiometer and measuring a second voltage across the wiper selected portion of the control potentiometer and the wiring terminals connected to the wiper selected portion;

a test module comparing the first and second voltages against an expected voltage, while voltage or current drive to the control potentiometer is inhibited, to detect if the first and second voltages are within a predetermined tolerance range of the expected voltage; and a third indicator module indicating a fault in the monitor interface circuit if said test module detects the first voltage or the second voltage is outside the predetermined tolerance range.

14. The method of claim 10 wherein said second module comprises:

an inhibit module for inhibiting voltage or current drive to the control potentiometer;

a measure module, while voltage or current drive to the control potentiometer is inhibited, measuring a first voltage across the control potentiometer and wiring terminals connected between full potentiometer and the monitor interface and measuring a second voltage across a wiper selected portion of the control potentiometer and the wiring terminals connected between the wiper selected portion and the monitor interface;

a test module comparing the first and second voltages against an expected voltage, while voltage or current drive to the control potentiometer is inhibited, to detect if the first and second voltages are within a predetermined tolerance range of the expected voltage; and an indicator module indicating a fault in the monitor interface if said test module detects the first voltage or the second voltage is outside the predetermined tolerance range.

* * * * *